United States Patent [19]
Senoo et al.

[11] Patent Number: 5,888,606
[45] Date of Patent: Mar. 30, 1999

[54] METHOD OF PREVENTING TRANSFER OF ADHESIVE SUBSTANCE TO DICING RING FRAME, PRESSURE-SENSITIVE ADHESIVE SHEET FOR USE IN THE METHOD AND WAFER WORKING SHEET HAVING THE PRESSURE-SENSITIVE ADHESIVE SHEET

[75] Inventors: Hideo Senoo, Wako; Takasi Sugino, Kawaguchi, both of Japan

[73] Assignee: Lintec Corporation, Japan

[21] Appl. No.: 873,356

[22] Filed: Jun. 12, 1997

Related U.S. Application Data

[62] Division of Ser. No. 563,620, Nov. 28, 1995, Pat. No. 5,705,016.

[30] Foreign Application Priority Data

Nov. 29, 1994 [JP] Japan .................................. 6-294790
Oct. 23, 1995 [JP] Japan .................................. 7-274077

[51] Int. Cl.⁶ .............................. B32B 3/10; B32B 7/06; B32B 7/12
[52] U.S. Cl. .......................... 428/66.6; 428/352; 428/354
[58] Field of Search .................... 428/66.6, 354, 428/352; 156/289

[56] References Cited

U.S. PATENT DOCUMENTS

| 4,138,304 | 2/1979 | Gantley | 156/268 |
| 4,609,964 | 9/1986 | Sobel | 428/66.6 |
| 4,890,763 | 1/1990 | Curiel | 220/455 |
| 5,110,388 | 5/1992 | Komiyama et al. | 156/229 |
| 5,118,567 | 6/1992 | Komiyama et al. | 428/345 |
| 5,356,949 | 10/1994 | Komiyama et al. | 522/102 |
| 5,705,016 | 1/1998 | Senoo et al. | 156/289 |

FOREIGN PATENT DOCUMENTS

| 0157508 | 10/1985 | European Pat. Off. | H01L 21/68 |
| 2221470 | 2/1990 | United Kingdom . | |

OTHER PUBLICATIONS

Abstract Publication No. 60–035531 for Japanese Application No. 58–144666, Feb. 23, 1985, one page.
Abstract Publication No. 61–028572 for Japanese Application No. 59–148566, Feb. 8, 1986, one page.
Yamane Kenji, Patent Abstracts of Japan, Dicing Tape of Ultravoilet Light Irradiation Type, Nov. 30, 1989, one page.
Matsushima Hiroshi; others, Patent Abstracts of Japan, Manufacture of Semiconductor Device, Sep. 3, 1992, one page.
Kuroda Hideo; others, Patent Abstract of Japan, Method of Dicing Semiconductor Wafer, Feb. 24, 1988, one page, 63043342.
Hitachi Seisakusho et al., Patent Abstracts of Japan, Supporter for Wafer, Aug. 10, 1984, one page. 59139645.

*Primary Examiner*—Alexander Thomas
*Attorney, Agent, or Firm*—Webb Ziesenheim Bruening Logsdon Orkin & Hanson, P.C.

[57] ABSTRACT

The present invention disposes an easily releasing layer on a surface intended for dicing tape sticking of a dicing ring frame to thereby enable preventing the transfer of an adhesive substance to the ring frame for use in semiconductor wafer working, reducing the frequency of cleaning of the ring frame to the requisite minimum and prolonging the life of the ring frame.

11 Claims, 4 Drawing Sheets

5,888,606

METHOD OF PREVENTING TRANSFER OF ADHESIVE SUBSTANCE TO DICING RING FRAME, PRESSURE-SENSITIVE ADHESIVE SHEET FOR USE IN THE METHOD AND WAFER WORKING SHEET HAVING THE PRESSURE-SENSITIVE ADHESIVE SHEET

This is a divisional of application Ser. No. 08/563,620 filed on Nov. 28, 1995 U.S. Pat. No. 5,705, 016.

BACKGROUND OF THE INVENTION

1. Field of the Invention

The present invention relates to a method of preventing the transfer of an adhesive substance to a ring frame for use in the wafer dicing process, a pressure-sensitive adhesive sheet used in the above method and a wafer working sheet having the above pressure-sensitive adhesive sheet.

2. Description of the Prior Art

The process for producing a semiconductor device includes a dicing step in which a semiconductor wafer having circuits formed through necessary pretreatments is cut and separated into a plurality of chips. In this step, a dicing sheet for fixing a wafer is stuck to a circular or square frame known as a ring frame, a semiconductor wafer is stuck on this dicing sheet and dicing is carried out every circuit to thereby obtain semiconductor chips.

The dicing step is followed by bonding machine expanding and chip mounting steps and further by wire bonding and molding steps to thereby complete production of a semiconductor device. Although the dicing sheet is fixed on the back of the wafer (chip) from the sticking of the wafer to a chip pickup step, after the pickup step, the dicing sheet is manually peeled from the ring frame and the ring frame is cleaned according to necessity and recycled.

In the conventional dicing sheet, a pressure-sensitive adhesive with low adhesive strength has been employed to facilitate the pickup. Accordingly, manual peeling of the dicing sheet from the ring frame has been facile.

However, the conventional dicing sheet having the pressure-sensitive adhesive with low adhesive strength has been unable to indicate a desired performance when a single type thereof is employed despite the need for a tape having higher dicing performance brought about in accordance with the recent-year trend for increase of semiconductor element integration and chip enlargement. Thus, a dicing sheet has been developed which can hold the wafer (chip) at a high adhesive strength during the dicing step but has its adhesive strength reduced by, for example, ultraviolet irradiation in the pickup step to thereby enable easy pickup of chips (see, for example, Japanese Patent Laid-open Publication Nos. 60(1985)-196956 and 61(1986)-28572).

Further, when a chip is die bonded, a die bonding adhesive such as one composed of an epoxy resin has been applied to the back of the chip. This operation is extremely time-consuming. Consequently, in recent years, a dicing sheet has been developed which has an adhesive layer capable of simultaneously serving as a wafer fixing pressure-sensitive adhesive and as a die bonding adhesive (see, for example, Japanese Patent Laid-open Publication Nos. 60(1985)-35531 and 2(1990)-32181).

In the former ultraviolet-curable dicing sheet, the adhesive is less irradiated with ultraviolet at the part where the dicing sheet is stuck to the ring frame (overlap width part) although the lowering of the adhesive strength is marked at the part irradiated with ultraviolet. Thus, peeling the dicing sheet from the ring frame is difficult because at the overlap width part the adhesive maintains a high adhesive strength and also its cohesive strength is small. Even if the peeling is effected, the adhesive remains on the ring frame (adhesive transfer).

In the latter dicing sheet, the adhesive strength at the interface between a base sheet and the adhesive layer is often set at low for transferring the adhesive layer to the chip at the time of chip mounting. Thus, peeling of the dicing sheet from the ring frame has often been accompanied by peeling at the interface between the base sheet and the adhesive layer of the dicing sheet to result in removal of only the base sheet while the adhesive is left on the ring frame.

This has unfavorably increased the frequency of cleaning for removing the adhesive from the ring frame and also shortened the life of the ring frame.

OBJECT OF THE INVENTION

The present invention has been made in view of the above prior art, and its object is to prevent the transfer of an adhesive substance to the ring frame, thereby reducing the frequency of ring frame cleaning to the requisite minimum and prolonging the life of the ring frame.

SUMMARY OF THE INVENTION

The method of preventing the transfer of an adhesive substance to a dicing ring frame according to the present invention comprises disposing an easily releasing layer on a surface intended for dicing sheet sticking of a dicing ring frame.

The above easily releasing layer is disposed, for example, by applying a release agent to the surface intended for dicing sheet sticking of the dicing ring frame.

Further, the present invention provides first and second pressure-sensitive adhesive sheets, each of which is used to dispose the above easily releasing layer.

The first pressure-sensitive adhesive sheet of the present invention comprises a ring-shaped base film and, formed on a surface thereof, a pressure-sensitive adhesive layer, the pressure-sensitive adhesive sheet having a size ensuring its fixability to the dicing ring frame, wherein a adhesive strength between the pressure-sensitive adhesive layer and the dicing ring frame is smaller than that between the base film and a dicing sheet.

The second pressure-sensitive adhesive sheet of the present invention comprises a ring-shaped base film and, formed on a surface thereof, a pressure-sensitive adhesive layer, the pressure-sensitive adhesive sheet having a size ensuring its fixability to the dicing ring frame, wherein the base film has its back subjected with releasing treatment.

It is preferred that each of the above first and second pressure-sensitive adhesive sheets have its inner circumference part provided with a stress relaxation part such as notches.

Still further, the present invention provides a wafer working sheet having the above pressure-sensitive adhesive sheet for preventing the transfer of an adhesive substance to a dicing ring frame.

The wafer working sheet of the present invention comprises the above pressure-sensitive adhesive sheet for preventing the transfer of an adhesive substance to a dicing ring frame and a dicing sheet, wherein the pressure-sensitive adhesive sheet is laminated via the base film thereof to an adhesive layer of the dicing sheet.

The above employed dicing sheet is preferably capable of serving both dicing and die bonding workings.

DESCRIPTION OF THE PREFERRED EMBODIMENTS

The present invention will now be described in greater detail with reference to the appended drawings.

Figure 1:
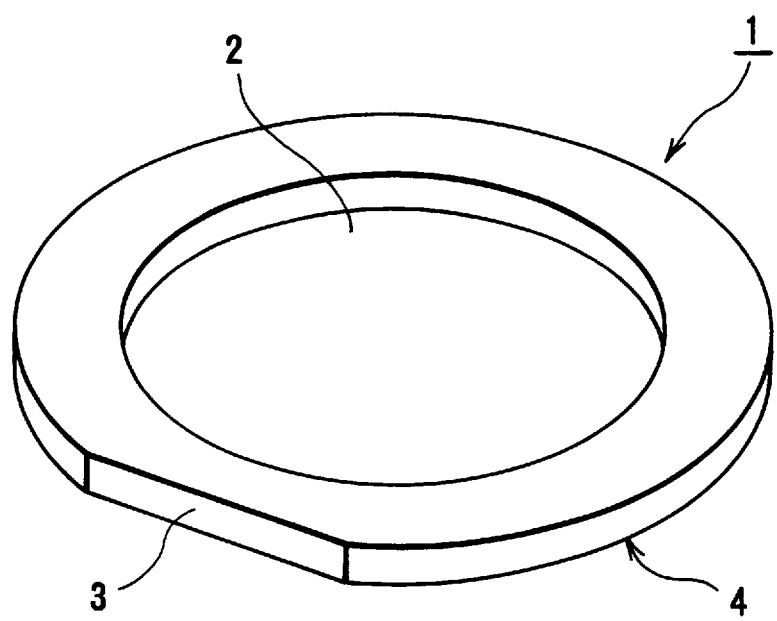
FIG. 1 is a perspective view of a ring frame.

FIG. 1 shows a typical form of a ring frame 1 suitable for use in the present invention. The ring frame 1 is generally a shaped article of a metal or plastic. The ring frame 1 has an inner opening 2 and, its inner diameter is sized so as to be slightly larger than the diameter of a wafer to be diced. A flat cut part for guide 3 is formed on part of the periphery of the ring frame 1. The shape of the ring frame 1 suitable for use in the present invention is not limited to that shown in FIG. 1 and any of the conventional ring frames with various shapes can be used.

This ring frame 1 is used with a dicing sheet stuck to its lower side. Hereinbelow, the side of the ring frame 1 to which the dicing sheet is stuck will be referred to as "surface intended for dicing sheet sticking 4".

Figure 2:
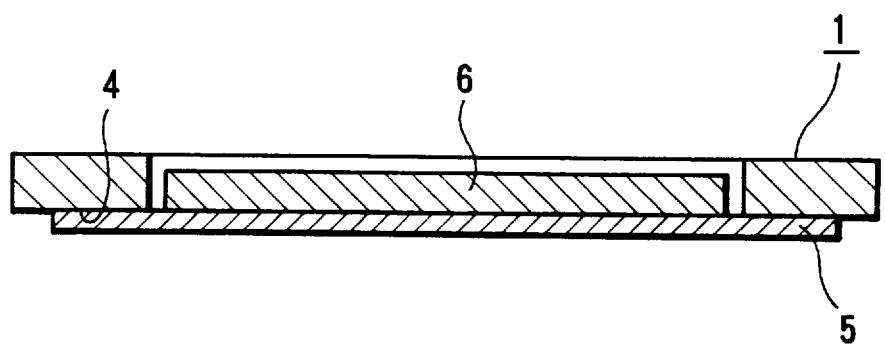
FIG. 2 is a sectional view showing the state of support of a wafer.

The ring frame 1 has a sectional structure as shown in FIG. 2, and the dicing sheet 5 is stuck to the surface intended for dicing sheet sticking 4 thereof. A semiconductor wafer 6 is supported by the dicing sheet 5 in the inner opening 2. Dicing is performed in this state, thereby obtaining semiconductor chips.

The dicing sheet 5 to be used in the present invention is not particularly limited and various conventional pressure-sensitive adhesive tapes can be employed. Examples thereof are as described in, for example, Japanese Patent Laid-open Publication Nos. 60(1985)-196956, 61(1986)-28572, 60(1985)-35531 and 2(1990)-32181. This dicing sheet 5 is generally composed of a base 5b and, formed thereon, an adhesive layer 5a.

The method of preventing the transfer of an adhesive substance to the dicing ring frame according to the present invention is characterized by applying release agent to the surface intended for dicing sheet sticking 4 of the ring frame 1. Providing the surface intended for dicing sheet sticking 4 with releasing treatment enables easily peeling the dicing sheet 5 from the ring frame 1 after completion of necessary process steps to thereby prevent the transfer of an adhesive substance to the ring frame 1, so that the frequency of cleaning of the ring frame 1 can be minimized and that the life of the ring frame 1 can be prolonged.

An easily releasing layer can be formed on the surface intended for dicing sheet sticking 4, for example, by any of the following:

(1) method in which a release agent is applied to the surface intended for dicing sheet sticking 4;

(2) method in which the first pressure-sensitive adhesive sheet of the present invention is stuck to the surface intended for dicing sheet sticking 4; and (3) method in which the second pressure-sensitive adhesive sheet of the present invention is stuck to the surface intended for dicing sheet sticking 4.

In the above method (1), the release agent is selected from among, for example, fluororesins, silicone resins and olefin resins, depending on the property of material of the ring frame 1. For example, when the ring frame 1 is made of a metal, a preferred release agent is a fluororesin. When the ring frame 1 is made of a plastic, a preferred release agent is a silicone resin.

The above release agent is applied to the surface intended for dicing sheet sticking 4 by brushing, dipping, printing or the like to thereby provide the surface subjected with releasing treatment.

This releasing treatment enables not only stably holding the dicing sheet 5 during the dicing but also easily peeling the dicing sheet 5 without adhesive transfer after the requisite process steps.

Figure 3:
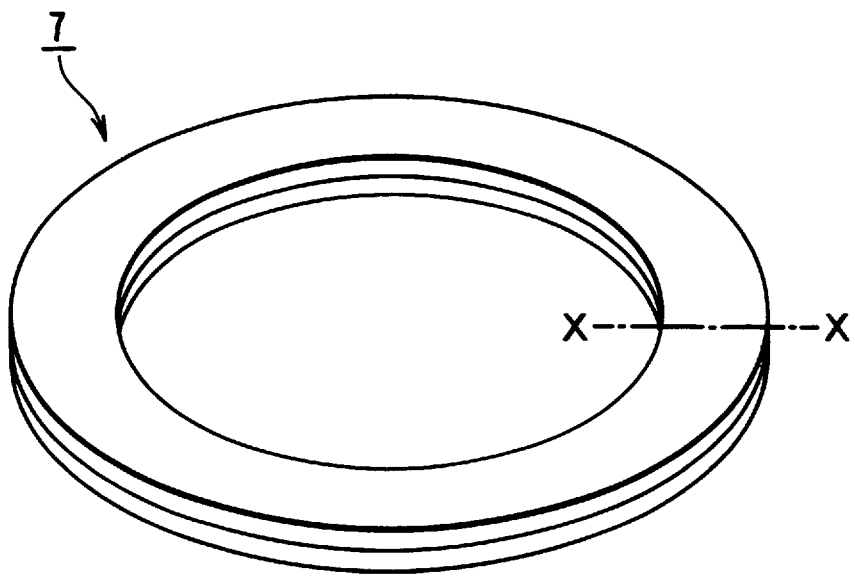
FIG. 3 is a perspective view of the first pressure-sensitive adhesive sheet of the present invention.
Figure 4:
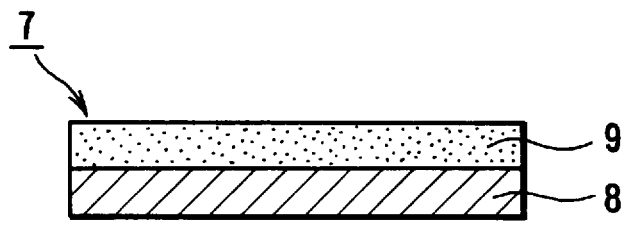
FIG. 4 is a sectional view on the line X—X of FIG. 3.

A perspective view of the first pressure-sensitive adhesive sheet 7 of the present invention which is employed in the above method (2) is shown in FIG. 3, and a sectional view on the line X—X thereof is shown in FIG. 4. As apparent from FIGS. 3 and 4, the first pressure-sensitive adhesive sheet 7 is comprised of a ring-shaped base film 8 and, formed on the surface thereof, a pressure-sensitive adhesive layer 9.

The size of the pressure-sensitive adhesive sheet 7 is satisfactory as long as it is as large as one enabling fixing the pressure-sensitive adhesive sheet 7 on the surface intended for dicing sheet sticking 4 of the ring frame 1. Specifically, it is satisfactory as long as the outer diameter of the pressure-sensitive adhesive sheet 7 is larger than the diameter of the inner opening of the ring frame 1.

Examples of suitably employed base films 8 include those which are made of polyethylene, polypropylene, polyvinyl chloride, polyethylene terephthalate, ethylene/vinyl acetate copolymer and ionomer resins. The thickness of each of these films is preferred to range from about 15 to 100 µm.

With respect to the adhesive strength of the pressure-sensitive adhesive layer 9, it is preferred that, as measured in accordance with Japanese Industrial Standard Z-0237, the adhesive strength be not greater than 300 g/25 mm and the holding power be at least 70,000 sec. If this adhesive strength requirement is met, the adhesive transfer is not caused by the peeling. The pressure-sensitive adhesive constituting the pressure-sensitive adhesive layer 9 is selected from among, for example, those based on acrylics, rubbers and silicones. The thickness of the pressure-sensitive adhesive layer 9 is preferred to range from about 5 to 50 µm.

Figure 5:
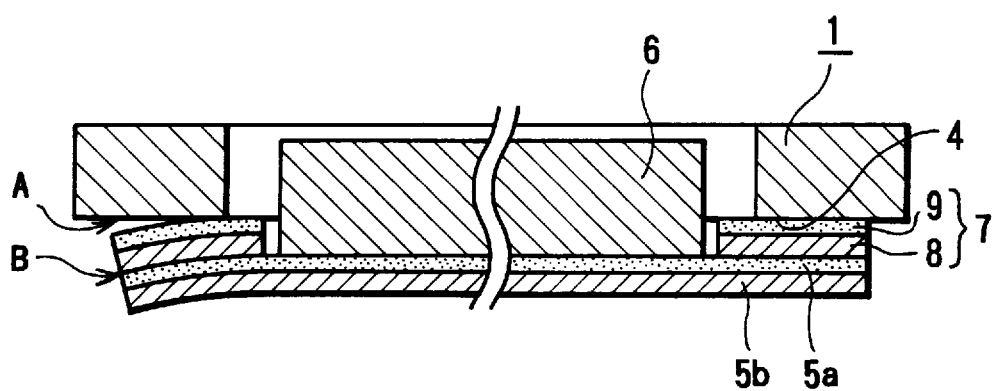
FIG. 5 shows the state of use of the first pressure-sensitive adhesive sheet of the present invention.

The above first pressure-sensitive adhesive sheet 7 of the present invention is stuck to the surface intended for dicing sheet sticking 4 of the ring frame 1 as shown in FIG. 5.

The adhesive strength A at the interface between the pressure-sensitive adhesive layer 9 and the ring frame 1 is set at a value lower than the adhesive strength B at the interface between the base film 8 and the pressure-sensitive adhesive layer 5a of the dicing sheet 5. The adhesive strength A at the interface between the pressure-sensitive adhesive layer 9 and the ring frame 1 is preferred to range from about 10 to 300 g/25 mm and to have an adhesive strength ratio (A/B) of 1/1.5 or below and especially 1/2 or below. When this adhesive strength ratio cannot be obtained depending on the performance of the dicing sheet 5, the surface (surface for dicing sheet sticking) of the base film 8 of the pressure-sensitive adhesive sheet 7 can be provided with corona treatment or the like to thereby cause the adhesive strength ratio to fall in the desirable value range.

When the above pressure-sensitive adhesive sheet 7 is stuck to the surface intended for dicing sheet sticking 4 of the ring frame 1, the dicing sheet 5 can be stably held during the dicing and, after the requisite process steps, peeling of the dicing sheet 5 is accompanied by simultaneous peeling of the pressure-sensitive adhesive sheet 7. The pressure-sensitive adhesive of the pressure-sensitive adhesive sheet 7 has low adherence, so that the pressure-sensitive adhesive sheet 7 is peeled without adhesive transfer.

The above pressure-sensitive adhesive sheet 7 may be stuck to the surface intended for dicing sheet sticking 4 of the ring frame 1 prior to the use of the ring frame 1.

Figure 6:
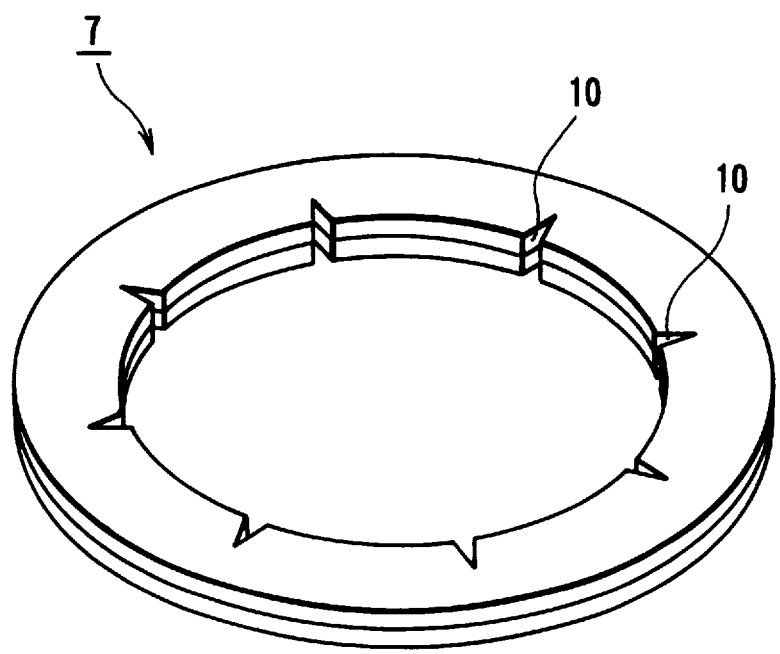
FIG. 6 is a perspective view of a modified form of the first pressure-sensitive adhesive sheet of the present invention.

Referring to FIG. 6, it is preferred that a stress relaxation part 10 be formed at the inner circumference part of the pressure-sensitive adhesive sheet 7. The stress relaxation part 10 is formed, for example, by providing the inner circumference part of the pressure-sensitive adhesive sheet 7 with small notches. It is preferred that the notches provided as the stress relaxation part 10 be formed radially in uniform positional relationship at the inner circumference part of the pressure-sensitive adhesive sheet 7. Although the number of notches is not particularly limited, it is preferred to be at least 4 and, especially, at least 6. The formation of this stress relaxation part 10 relaxes the stress applied to the pressure-sensitive adhesive sheet 7 when the dicing sheet 5 is expanded to thereby prevent the stress from localization, so that the expansion can be smoothly performed.

Figure 7:
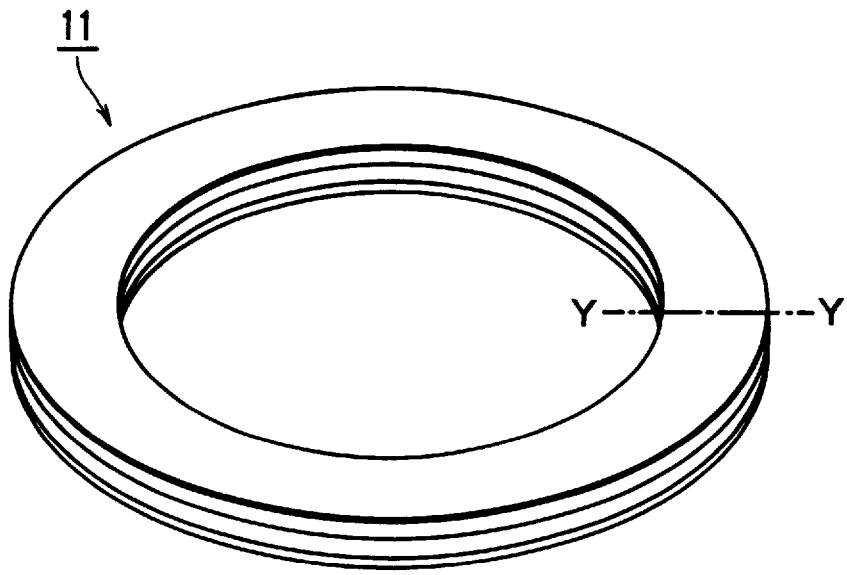
FIG. 7 is a perspective view of the second pressure-sensitive adhesive sheet of the present invention.
Figure 8:
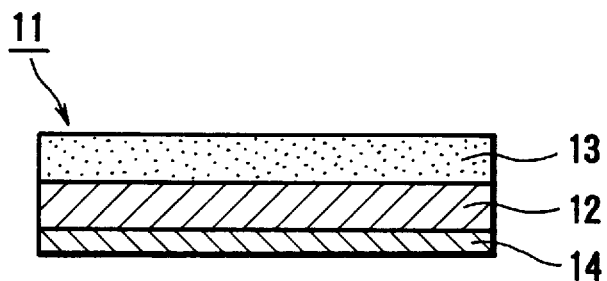
FIG. 8 is a sectional view on the line Y—Y of FIG. 7.

A perspective view of the second pressure-sensitive adhesive sheet 11 of the present invention which is employed in the above method (3) is shown in FIG. 7, and a sectional view on the line Y—Y thereof is shown in FIG. 8. As apparent from FIGS. 7 and 8, the second pressure-sensitive adhesive sheet 11 is comprised of a ring-shaped base film 12 and, formed on the surface thereof, a pressure-sensitive adhesive layer 13.

The size of the pressure-sensitive adhesive sheet 11 is satisfactory as long as it is as large as one enabling fixing the pressure-sensitive adhesive sheet 11 on the surface intended for dicing sheet sticking 4 of the ring frame 1. Specifically, it is satisfactory as long as the outer diameter of the pressure-sensitive adhesive sheet 11 is larger than the diameter of the inner opening of the ring frame 1.

The base film 12 can be composed of the same material as employed in the base film 8 of the above first pressure-sensitive adhesive sheet 7. Its thickness is preferred to range from about 15 to 100 μm. The back of the base film 12 is subjected to releasing treatment to thereby form a releasing treatment surface 14. The releasing treatment is conducted, for example, by applying a release agent of a fluororesin, a silicone resin, an olefin resin or the like to the back of the base film 12. This releasing treatment reduces the adhesive strength between the base film 12 and the dicing sheet 5, thereby enabling peeling the dicing sheet 5 without adhesive transfer.

With respect to the adhesive strength of the pressure-sensitive adhesive layer 13, it is preferred that, as measured in accordance with Japanese Industrial Standard Z-0237, the adhesive strength be 200 g/25 mm or greater and the holding power be at least 70,000 sec. The pressure-sensitive adhesive constituting the pressure-sensitive adhesive layer 13 is selected from among, for example, those based on acrylics, rubbers and silicones. The thickness of the pressure-sensitive adhesive layer 13 is preferred to range from about 5 to 50 μm.

Figure 9:
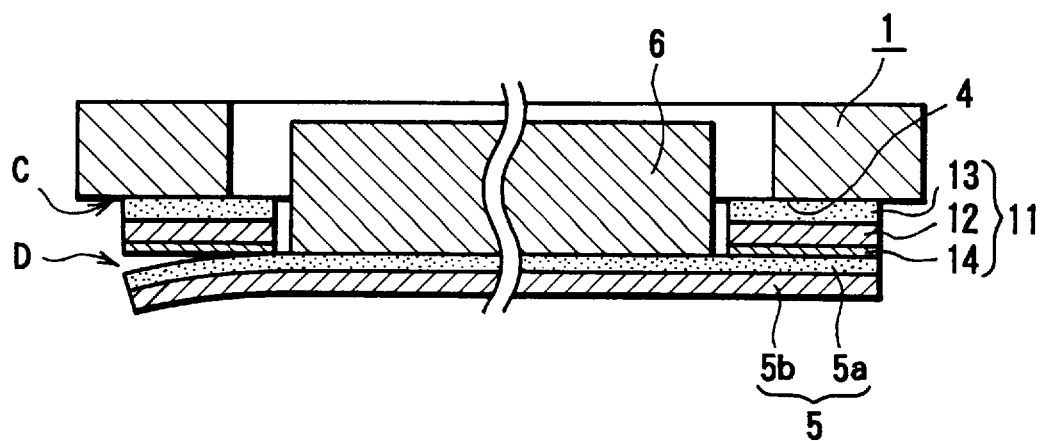
FIG. 9 shows the state of use of the second pressure-sensitive adhesive sheet of the present invention.

The above second pressure-sensitive adhesive sheet 11 of the present invention is stuck to the surface intended for dicing sheet sticking 4 of the ring frame 1 as shown in FIG. 9.

The adhesive strength C at the interface between the pressure-sensitive adhesive layer 13 and the ring frame 1 is larger than the adhesive strength D at the interface between the base film 12 and the pressure-sensitive adhesive layer 5a of the dicing sheet 5 because of the releasing treatment surface 14 formed on the back of the base film 12. The adhesive strength C at the interface between the pressure-sensitive adhesive layer 13 and the ring frame 1 is preferred to range from about 200 to 1000 g/25 mm and to have an adhesive strength ratio (C/D) of 1.5/1 or higher and especially 2/1 or higher.

When the above pressure-sensitive adhesive sheet 11 is stuck to the surface intended for dicing sheet sticking 4 of the ring frame 1, the dicing sheet 5 can be stably held during the dicing and, after the requisite process steps, peeling of the dicing sheet 5 is accompanied by easy peeling at the interface between the pressure-sensitive adhesive sheet 11 and the dicing sheet 5. The pressure-sensitive adhesive sheet 11 remains on the ring frame 1. No adhesive transfer occurs onto the back of the base film 12 of the pressure-sensitive adhesive sheet 11 remaining on the dicing ring frame 1. Therefore, the dicing ring frame 1 with the pressure-sensitive adhesive sheet 11 attached thereto can be recycled.

Repeated use of the dicing ring frame 1 with the pressure-sensitive adhesive sheet 11 attached thereto may cause the same to suffer from fouling by friction, etc. However, even at the use limit, peeling is easy if the adhesive properties of the pressure-sensitive adhesive sheet 11 of the present invention are as described above, so that the pressure-sensitive adhesive sheet 11 can be replaced by a new one to thereby enable recycling the ring frame 1.

The above pressure-sensitive adhesive sheet 11 may be stuck to the surface intended for dicing sheet sticking 4 of the ring frame 1 prior to the use of the ring frame 1.

Moreover, it is preferred that a stress relaxation part 10 be formed at the inner circumference part of the pressure-sensitive adhesive sheet 11 as in the above first pressure-sensitive adhesive sheet 7.

The wafer working sheet of the present invention will be described below.

The wafer working sheet of the present invention is comprised of the above pressure-sensitive adhesive sheet 7 or 11 previously laminated onto the dicing sheet 5. The pressure-sensitive adhesive sheet 7 is laminated in a manner such that it is stuck via the base film 8 thereof to the adhesive layer 5a of the dicing sheet 5 (see FIG. 5). The pressure-sensitive adhesive sheet 11 is laminated in a manner such that the side of releasing treatment surface 14 of the base film 12 thereof is stuck to the adhesive layer 5a of the dicing sheet 5 (see FIG. 9).

Not only a dicing sheet intended for exclusive use in dicing working but also a dicing sheet capable of serving both dicing and die bonding workings can be used as the dicing sheet 5 as a member of the wafer working sheet of the present invention.

The dicing sheet intended for exclusive use in dicing working is comprised of a base 5b and, unpeelably laminated thereto, a pressure-sensitive adhesive layer 5a.

The pressure-sensitive adhesive of the adhesive layer 5a of the dicing sheet intended for exclusive use in dicing working may be either one of the low adhesive strength type adhesive constantly exhibiting low adhesive strength or one of the ultraviolet-curable type adhesive whose adhesive strength is lowered by ultraviolet irradiation conducted before the pickup step.

The pressure-sensitive adhesive of the low adhesive strength type is a pressure-sensitive adhesive regulated to have a low adhesive strength and composed of a polymer of an acrylic, a rubber, a silicone or the like which is capable of exhibiting pressure-sensitive adherence. In the present invention, it is preferred that an acrylic pressure-sensitive adhesive be employed from the viewpoint of general-purpose availability, ease in the control of adherence properties, etc.

The ultraviolet-curable pressure-sensitive adhesive is comprised of a pressure-sensitive adhesive component and an ultraviolet-curable component. The above polymer capable of exhibiting pressure sensitivity is used as the pressure-sensitive adhesive component. A compound having a carbon-to-carbon double bond or a compound having an oxirane ring is used as the ultraviolet-curable component to which a photopolymerization initiator is appropriately added. In particular, those described in Japanese Patent Laid-open Publication Nos. 60(1985)-196956 and 61(1986)-28572 can suitably be employed.

The above pressure-sensitive adhesive layer of the low adhesive strength type and the ultraviolet-curable pressure-sensitive adhesive layer each have a thickness generally ranging from about 1 to 100 $\mu$m and preferably from about 5 to 30 $\mu$m.

A general-purpose monolayer or multilayer film of a polyolefin or the like can be used as the base 5b, one side of the base 5b close to the adhesive layer 5a may be subjected to corona or primer treatment for increasing the strength of bond with the adhesive layer 5a. The thickness of the base 5b generally ranges from about 10 to 300 $\mu$m and preferably from about 50 to 200 $\mu$m.

The following will describe the dicing sheet capable of serving both dicing and die bonding workings.

The dicing sheet capable of serving both dicing and die bonding workings is comprised of a base 5b and, peelably laminated thereto, an adhesive layer for die fixing.

The adhesive layer for die fixing is pressure sensitive and adherent at ordinary or elevated temperatures before dicing working. It can stick to a semiconductor wafer to thereby enable dicing working and can bond a die and a lead frame, which are strongly bonded and fixed by heat treatment.

As the adhesive for die fixing, there can be mentioned one composed of a B-stage (semi-cured) thermosetting adhesive component and one composed of a low-molecular-weight thermosetting adhesive component together with a polymer component.

An ultraviolet-curable component can further be added to the adhesive layer for die fixing. Ultraviolet radiation improves the peelability of the thus obtained adhesive layer from the base to thereby facilitate the pickup working. For example, those described in Japanese Patent Laid-open Publication No. 2(1990)-32181 can suitably be employed as the above adhesive layer for die fixing.

The thickness of the above adhesive layer for die fixing generally ranges from about 5 to 200 $\mu$m and preferably from about 10 to 100 $\mu$m.

The base 5b for use in the dicing sheet capable of serving both dicing and die bonding workings is fundamentally the same as that of the dicing sheet intended for exclusive use in dicing working.

It is preferred that the base sheet 5b have a surface tension of not greater than 40 dyn/cm and, especially, not greater than 35 dyn/cm. The use of the base with this surface tension improves the peelability from the adhesive layer to thereby improve the pickup adaptability. This base with low surface tension can be obtained by appropriately selecting the material or by subjecting the surface of the base with releasing treatment such as application of a silicone resin or the like.

The procedure of use of the above wafer working sheet is as follows, although the working sequence can appropriately be altered.

The adhesive layer 5a of the wafer working sheet is stuck to the wafer to be diced at ordinary or elevated temperature under pressure as shown in FIG. 5 or 9. Subsequently, the pressure-sensitive adhesive sheet 7 or 11 is stuck to the surface intended for dicing sheet sticking 4 of the ring frame 1 at ordinary temperature, and the wafer working sheet is fixed with the ring frame 1. In this state, the wafer is subjected to the steps of dicing, cleaning and drying.

When the adhesive layer 5a contains the ultraviolet-curable component as described in Japanese Patent Laid-open Publication Nos. 61(1986)-28572 and 2(1990)-32181, ultraviolet irradiation is carried out prior to the pickup step to thereby attain peelability improvement.

According to necessity, the wafer working sheet is subjected to the expanding step. In this step, the presence of the stress relaxation part on the pressure-sensitive adhesive sheet 7 or 11 leads to desired chip spacing and alignment.

When the dicing sheet intended for exclusive use in dicing working has been used in the wafer working sheet, only the die is picked up in the pickup step and thereafter conventional semiconductor production steps are carried out.

When the dicing sheet capable of serving both dicing and die bonding workings has been used in the wafer working sheet, the die is picked up in the state of having a die fixing adhesive layer laminated thereto and mounted on the lead frame. Subsequent heat treatment strongly bonds the die and the lead frame to attain fixing thereof.

In any instances, the above special pressure-sensitive adhesive sheet 7 or 11 is interposed between the ring frame 1 and the dicing sheet 5, so that the dicing sheet 5 can easily be peeled from the ring frame 1 without the remaining of an adhesive substance, etc. on the ring frame 1. Therefore, the ring frame 1 has no need of being cleaned and can be recycled as it is.

EFFECT OF THE INVENTION

The present invention enables preventing the transfer of an adhesive substance to the ring frame, reducing the frequency of cleaning of the ring frame to the requisite minimum and prolonging the life of the ring frame.

EXAMPLES

The present invention will further be illustrated with reference to the following Examples which in no way limits the scope of the invention.

Example 1

Fluororesin release agent (Teflon (trade name) FEP Green, produced by E. I. Du Pont De NEMOURS AND COMPANY) was applied by brushing to ring frame (MODTF (trade name) 2-6-1, manufactured by DISCO Corp.) so as to obtain a dry film thickness of 10 $\mu$m and dried.

Use was made of a dicing sheet capable of serving both dicing and die bonding workings which consisted of base (80 μm thick polyolefin), a pressure-sensitive adhesive (50 μm thick acrylic adhesive containing thermosetting epoxy resin) and a release film (38 μm thick polyethylene terephthalate film having one side provided with peeling treatment).

This sheet capable of serving both dicing and die bonding workings was stuck to the release-agent-coated side of the ring frame. The adhesive side of the sheet capable of serving both dicing and die bonding workings was diced under full cut condition and the sheet capable of serving both dicing and die bonding workings was manually peeled. These were repeated 50 times but no adhesive transfer on the ring frame occurred. Moreover, the sheet capable of serving both dicing and die bonding workings was allowed to stand still at 40° C. for 3 days in the state of being stuck to the release-agent-coated side of the ring frame. Thereafter, the sheet capable of serving both dicing and die bonding workings was manually peeled but no adhesive transfer on the ring frame occurred.

Example 2

A pressure-sensitive adhesive sheet consisting of a base of polyethylene terephthalate (25 μm) and a pressure-sensitive acrylic adhesive (M0003 (trade name) produced by Lintec Corporation, amount of coating: 20 g/m$^2$) was punched in the state of retaining a release film in conformity to the shape of the overlap width of the ring frame, and peripheral and inner central unneeded parts were removed.

Subsequently, the same sheet capable of serving both dicing and die bonding workings as employed in Example 1 was laminated while peeling its release film to the above punched pressure-sensitive adhesive sheet and cut along the overlap width of the ring frame.

The adhesive strength between the pressure-sensitive adhesive sheet and the ring frame was 70 g/25 mm as measured in accordance with Japanese Industrial Standard Z-0237, and the holding power of the pressure-sensitive adhesive layer of the pressure-sensitive adhesive sheet was more than 70,000 sec. Further, the adhesive strength at the interface between the adhesive layer of the sheet capable of serving both dicing and die bonding workings and the base of the pressure-sensitive adhesive sheet was 150 g/25 mm.

The laminated sheet was stuck to the ring frame (MODTF (trade name) 2-6-1, manufactured by DISCO Corp.). The adhesive side of the sheet capable of serving both dicing and die bonding workings was diced under full cut condition and the sheet capable of serving both dicing and die bonding workings was manually peeled from the ring frame. These were repeated 50 times but no adhesive transfer occurred. Moreover, the sheet capable of serving both dicing and die bonding workings was allowed to stand still at 40° C. for 3 days in the state of being stuck to the ring frame. Thereafter, the sheet capable of serving both dicing and die bonding workings was manually peeled. The sheet capable of serving both dicing and die bonding workings was accurately peeled while holding the pressure-sensitive adhesive sheet laminated and the ring frame suffered from no adhesive transfer.

Example 3

A silicone release agent was applied in an amount of 0.1 g/m$^2$ to a polyethylene terephthalate base (thickness: 25 μm) and a pressure-sensitive acrylic adhesive (MF (trade name) produced by Lintec Corporation, amount of coating: 20 g/m$^2$) was applied to the opposite side of the base, thereby obtaining a pressure-sensitive adhesive sheet. The pressure-sensitive adhesive sheet was punched in a manner such that its periphery agreed with the overlap width of the ring frame and that its inner circumference agreed with the diameter of the through hole of the ring frame.

The adhesive strength between the pressure-sensitive adhesive sheet and the ring frame was 200 g/25 mm as measured in accordance with Japanese Industrial Standard Z-0237, and the holding power of the pressure-sensitive adhesive layer of the pressure-sensitive adhesive sheet was more than 70,000 sec. Further, the adhesive strength at the interface between the adhesive layer of the sheet capable of serving both dicing and die bonding workings as employed in Example 1 and the base of the pressure-sensitive adhesive sheet was 15 g/25 mm.

The pressure-sensitive adhesive sheet was stuck to the ring frame (MODTF (trade name) 2-6-1, manufactured by DISCO Corp.) and then the same sheet capable of serving both dicing and die bonding workings was stuck thereto. The adhesive side of the dicing sheet was diced under full cut condition and the sheet capable of serving both dicing and die bonding workings was manually peeled. These were repeated 50 times but no adhesive transfer on the ring frame occurred. Moreover, the sheet capable of serving both dicing and die bonding workings was allowed to stand still at 40° C. for 3 days in the state of being stuck to the ring frame. Thereafter, both the sheet capable of serving both dicing and die bonding workings and the adhesive sheet was manually peeled but no adhesive transfer on the ring frame occurred.

Example 4

A pressure-sensitive adhesive sheet consisting of a base of soft polyvinyl chloride (70 μm) and a pressure-sensitive adhesive layer of removable acrylic pressure-sensitive adhesive (amount of coating: 10 g/m$^2$) was prepared. The pressure-sensitive adhesive sheet was punched in the state of retaining a release film with the use of a cutting edge to thereby simultaneously conduct formation of a stress relaxation part and removal of inner central unneeded part.

Subsequently, the same sheet capable of serving both dicing and die bonding workings as employed in Example 1 was laminated while peeling its release film to the above punched pressure-sensitive adhesive sheet, thereby obtaining a wafer working sheet.

The wafer working sheet was formed so as to have an outer diameter of 206 mm, an inner diameter of pressure-sensitive adhesive sheet of 170 mm and a stress relaxation part radially arranged at eight locations in the direction from the inner circumferential edge toward the periphery of the pressure-sensitive adhesive sheet with a size of 10 mm. The adhesive strength between the pressure-sensitive adhesive sheet and the ring frame was 190 g/25 mm as measured in accordance with Japanese Industrial Standard Z-0237, and the holding power of the pressure-sensitive adhesive layer of the pressure-sensitive adhesive sheet was more than 70,000 sec. Further, the adhesive strength at the interface between the adhesive layer of the sheet capable of serving both dicing and die bonding workings and the base of the pressure-sensitive adhesive sheet was 350 g/25 mm.

The laminated sheet was stuck to the ring frame (MODTF (trade name) 2-6-1, manufactured by DISCO Corp.). The adhesive side of the sheet capable of serving both dicing and die bonding workings was diced under full cut condition and the sheet capable of serving both dicing and die bonding workings was manually peeled from the ring frame. These were repeated 50 times but no adhesive transfer on the ring frame occurred. Moreover, the sheet capable of serving both dicing and die bonding workings was allowed to stand still at 40° C. for 3 days in the state of being stuck to the ring frame. Thereafter, the sheet capable of serving both dicing and die bonding workings was manually peeled. The sheet capable of serving both dicing and die bonding workings was accurately peeled while holding the pressure-sensitive adhesive sheet of the lower side laminated and the ring frame suffered from no adhesive transfer.

The wafer working sheet was stuck to a silicon wafer of 6 inch in diameter, and the silicon wafer was diced into 5 mm×5 mm chips by the use of a dicing device. Thereafter, the wafer working sheet was placed with the silicon wafer side up on a cylinder of 190 mm in outer diameter and a load was applied to the ring frame so as to effect a pull down of 15 mm. Thus, expansion was executed. No local load was applied to the wafer working sheet and the chip spacing was satisfactory.

What is claimed is:

1. A wafer working sheet comprising:

a dicing sheet having an adhesive layer; and a pressure-sensitive adhesive sheet for preventing the transfer of an adhesive substance to a dicing ring frame, said pressure-sensitive adhesive sheet comprising a ring-shaped base film and, formed on a surface thereof, a pressure-sensitive adhesive layer, said pressure-sensitive adhesive sheet being laminated via the base film to the adhesive layer of the dicing sheet and having a size ensuring its fixability to the dicing ring frame, wherein an adhesive strength between the pressure-sensitive adhesive layer and the dicing ring frame is smaller than that between the base film and the dicing sheet.

2. The wafer working sheet as claimed in claim 1, wherein the pressure-sensitive adhesive sheet includes an inner circumference part provided with a stress relaxation part.

3. The wafer working sheet as claimed in claim 2, wherein the stress relaxation part includes notches disposed at the inner circumference part of the pressure-sensitive adhesive sheet.

4. The wafer working sheet as claimed in claim 3, wherein the dicing sheet is capable of serving both dicing and die bonding workings.

5. A pressure-sensitive adhesive sheet for preventing the transfer of an adhesive substance to a dicing ring frame, said pressure-sensitive adhesive sheet comprising a ring-shaped base film and, formed on a surface thereof, a pressure-sensitive adhesive layer, said pressure-sensitive adhesive sheet having a size ensuring its fixability to the dicing ring frame, wherein the base film has a back subjected to releasing treatment.

6. The pressure-sensitive adhesive sheet as claimed in claim 5, including an inner circumference part provided with a stress relaxation part.

7. The pressure-sensitive adhesive sheet as claimed in claim 6, wherein the stress relaxation part includes notches disposed at the inner circumference part of the pressure-sensitive adhesive sheet.

8. A wafer working sheet comprising a pressure-sensitive adhesive sheet for preventing the transfer of an adhesive substance to a dicing ring frame as claimed in claim 5, and a dicing sheet having an adhesive layer, wherein the pressure-sensitive adhesive sheet includes a base film and is laminated via the base film to the adhesive layer of the dicing sheet.

9. The wafer working sheet as claimed in claim 8, wherein the dicing sheet is capable of serving both dicing and die bonding workings.

10. A dicing sheet assembly comprising:

a dicing ring frame;

a dicing sheet having an adhesive layer; and a pressure-sensitive adhesive sheet disposed between said dicing ring frame and said dicing sheet for preventing the transfer of an adhesive substance to the dicing ring frame, said pressure-sensitive adhesive sheet comprising a ring-shaped base film and, formed on a surface thereof, a pressure-sensitive adhesive layer, said pressure-sensitive adhesive sheet being laminated via the base film to the adhesive layer of the dicing sheet and having a size ensuring its fixability to the dicing ring frame, wherein an adhesive strength between the pressure-sensitive adhesive layer and the dicing ring frame is smaller than that between the base film and the dicing sheet.

11. A dicing sheet assembly comprising:

a dicing ring frame;

a dicing sheet; and a pressure-sensitive adhesive sheet disposed between said dicing ring frame and said dicing sheet for preventing the transfer of an adhesive substance to the dicing ring frame, said pressure-sensitive adhesive sheet comprising a ring-shaped base film and, formed on a surface thereof, a pressure-sensitive adhesive layer, said pressure-sensitive adhesive sheet having a size ensuring its fixability to the dicing ring frame, wherein the base film has a back subjected to releasing treatment.

* * * * *

UNITED STATES PATENT AND TRADEMARK OFFICE
CERTIFICATE OF CORRECTION

PATENT NO. : 5,388,606
DATED : March 30, 1999
INVENTOR(S) : Hideo Senoo and Takasi Sugino It is certified that error appears in the above-identified patent and that said Letters Patent is hereby corrected as shown below:

Column 5 Line 33 "at least 4" should read --at least 4-- (delete bold).

Column 5 Line 33 "at least 6" should read --at least 6-- (delete bold).

Signed and Sealed this

Twenty-eighth Day of September, 1999

Attest:

Q. TODD DICKINSON

*Attesting Officer*    *Acting Commissioner of Patents and Trademarks*